United States Patent
Ward et al.

(10) Patent No.: US 7,930,610 B2
(45) Date of Patent: Apr. 19, 2011

(54) SYSTEM AND METHOD FOR POWER REDUCTION THROUGH POWER AWARE LATCH WEIGHTING OF COMPLEX SUB-CIRCUITS

(75) Inventors: Samuel I. Ward, Round Rock, TX (US); Benjiman L. Goodman, Cedar Park, TX (US); Joshua P. Hernandez, Paige, TX (US); Linton B. Ward, Jr., Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 12/206,781

(22) Filed: Sep. 9, 2008

(65) Prior Publication Data

US 2010/0064190 A1    Mar. 11, 2010

(51) Int. Cl.
*G01R 31/28* (2006.01)
(52) U.S. Cl. ........ 714/732; 714/726; 714/729; 714/742; 324/763; 324/765
(58) Field of Classification Search .................. 714/732, 714/726, 729, 742; 324/763, 765
See application file for complete search history.

(56) References Cited

U.S. PATENT DOCUMENTS

| | | | |
|---|---|---|---|
| 6,658,616 | B1 | 12/2003 | Chang et al. |
| 6,968,489 | B2 | 11/2005 | Motika et al. |
| 6,986,090 | B2 * | 1/2006 | Hathaway et al. ............ 714/727 |
| 7,743,306 | B2 * | 6/2010 | Wen et al. ..................... 714/739 |
| 2003/0140293 | A1 | 7/2003 | Motika et al. |
| 2003/0163297 | A1 | 8/2003 | Khaira et al. |
| 2008/0235543 | A1 * | 9/2008 | Wen et al. ..................... 714/724 |

OTHER PUBLICATIONS

Lin et al., A Cocktail Approach on Random Access Scan Toward Low Power and High Efficiency Test, 2005, IEEE, pp. 94-99.*
Wu wt al., Scan-Chain Reordering for Minimizing Scan-Shift Power Based on Non-Specified Test Cubes, Apr. 27, 2008, IEEE, pp. 147-154.*
Maiti et al., Don't care filling for power minimization in VLSI circuit testing, May 18, 2008, IEEE, pp. 2637-2640.*
Lee et al., Reduction of Power and Test Time by Removing Cluster of Don't-Care from Test Data Set, 2005, IEEE, pp. 1-2.*
Kajihara et al., On identifying don't care inputs of test patterns for combinational circuits, 2001, IEEE, pp. 364-369.*
S. Wang and S.K. Gupta "ATPG for heat dissipation minimization during scan testing," Proc. 1994 IEEE Int. Test Conf., Oct. 1994, pp. 250-258.
R. Saukaralingam, R.R. Oruganti, and N.A. Touba, "Static compaction techniques to control can vector power dissipation," Proc. 2000 IEEE VLSI Test Symp., Apr.-May 2000, pp. 35-40.

* cited by examiner

*Primary Examiner* — John J Tabone, Jr.
(74) *Attorney, Agent, or Firm* — Patrick E. Caldwell, Esq.; The Caldwell Firm, LLC (57) ABSTRACT

A system comprises a circuit analysis module configured to analyze a device under test (DUT), the DUT comprising a plurality of latches coupled together in a scan chain. The circuit analysis module analyzes a DUT for sub-circuits within the DUT and identifies a logical description of identified sub-circuits. A don't-care analysis module couples to the circuit analysis module identifies absolute don't-care latches associated with the identified sub-circuits. A sub-circuit exception module couples to the circuit analysis module and selects weighted input values for an identified sub-circuit, based on the identified absolute don't-care latches and the logical description of the identified sub-circuit. The sub-circuit exception module stores the selected weighted input values for the sub-circuit and associates the selected weighted input values with the logical description.

20 Claims, 5 Drawing Sheets

SYSTEM AND METHOD FOR POWER REDUCTION THROUGH POWER AWARE LATCH WEIGHTING OF COMPLEX SUB-CIRCUITS

CROSS-REFERENCE TO RELATED APPLICATIONS

This application relates to co-pending U.S. patent application Ser. No. 12/206,789 entitled SYSTEM AND METHOD FOR POWER REDUCTION THROUGH POWER AWARE LATCH WEIGHTING, filed concurrently herewith.

TECHNICAL FIELD

The present invention relates generally to the field of logic device testing, and more particularly, a system and method power reduction through power aware latch weighting of complex sub-circuits.

BACKGROUND OF THE INVENTION

Modern electronic testing systems perform certain electronic circuit tests at the designed operational speed of the device under test (DUT). But performing structural tests of electronic devices at operation speed can introduce many problems. One primary problem is increased power consumption during switching. This increased power consumption experienced during operational speed testing can often be much higher than the power consumption experienced during the DUT's normal operation. As such, the increased power consumption can affect test results, causing the device under test to fail, or appear to fail. For example, in some fault tests, increased switching power consumption during scan capture can degrade performance to the point of test failure. Additionally, in all fault tests, the increased power consumption during switching can aggravate IR-drop and crosstalk, which can also manifest as a failed test. Worse, increased power consumption can cause faults, introducing stress-related failures in the device under test.

In order to address this problem, industry has developed testing methods that attempt to reduce power consumption during the testing process. Many conventional methods restrict the test application to only those portions of the DUT that are currently being tested. The logic operators and other portions of the DUT that are not being tested are assigned a random bit as a place holder during the testing process. These logic operators are called non-determinative operators and often notated as "do not care" or don't-care bits.

Conventional systems randomly fill don't-care with either a zero or a one. The typical random fill method can provide a slight increase in fault coverage by detecting faults not explicitly targeted during a test, sometimes referred to as "fortuitous detection." Industry studies have shown fortuitous detection coverage to be very similar to randomly filled don't-care values, which is relatively high for the first few patterns. However, the coverage provided by fortuitous detection drops very quickly with subsequent patterns.

Further, randomly filling the don't-care bits can also introduce power related problems. For example, randomly filling the don't-care bits can cause an increased number of transitions during scan-in, relative to simply filling in the don't-care bits with all zeros. The increase number of transitions can, in turn, cause high power dissipation. The increased power dissipation during scan-in can be mitigated somewhat by lowering the test frequency, but lowering the test frequency increases the total time necessary to conduct the test. Worse, often 80% or more of the data bits in the scan chain being shifted into the chip are don't-care values, which magnifies the problems caused by randomly filling the "don't' care" bits.

Industry has developed several heuristic methods to select the fill value for don't-care bits. One modern heuristic method assigns all don't-care bits a value of zero, called the "tie to zero" method. Another modern method assigns all don't-care bits a value of one, called the "tie to one" method. The "thousand fill" method fills the don't-care bits of the first 1,000 post compaction results with all zeros, and fills the don't-care bits of the next 1,000 patterns with all ones, repeating the alternation in blocks of 1,000 for the remainder of the test patterns. The "random chain" method randomly selects half of the scan chains, filling the don't-care bits in the selected chains with all ones, and filling the don't-care bits in the rest of the chains randomly.

The "fill adjacent" method uses information about the care bits to fill in values of the don't-care bits on a care bit by care bit basis. Specifically, the fill adjacent method fills don't-care bits with the most recent care bit value until another care bit is reached, after which the new care bit value is applied. The "minimum-transition fill" method uses a process similar to that of the "fill adjacent" method, and includes aspects to reduce transitions in the test vector. The "random four adjacent" method randomly selects four chains, filling the don't-care bits of the selected chains according to the fill adjacent method, and fills the don't-care bits in the remaining patterns randomly.

As shown, current heuristic methods for modern electronic testing systems try to reduce overall switching power by reducing the overall average power. Most systems use a general method for determining all don't-care values. But a general method, applied to all devices under test, does not take into account actual circuit topology to reduce power, largely because current heuristics cannot efficiently process actual circuit topography. These conventional methods look only at specific simple heuristics to attempt to reduce the power on an average basis, across many different devices. As such, typical methods to reduce average power fail to achieve the power reduction possible if actual circuit topography were considered.

Therefore, there is a need for a system and/or method for power reduction in -speed circuit testing that addresses at least some of the problems and disadvantages associated with conventional systems and methods.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

A system comprises a circuit analysis module configured to analyze a device under test (DUT), the DUT comprising a plurality of latches coupled together in a scan chain. The circuit analysis module analyzes a DUT for sub-circuits within the DUT and identifies a logical description of identified sub-circuits. A don't-care analysis module couples to the circuit analysis module identifies absolute don't-care latches associated with the identified sub-circuits. A sub-circuit exception module couples to the circuit analysis module and selects weighted input values for an identified sub-circuit, based on the identified absolute don't-care latches and the logical description of the identified sub-circuit. The sub-circuit exception module stores the selected weighted input values for the sub-circuit and associates the selected weighted input values with the logical description.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Figure 1:
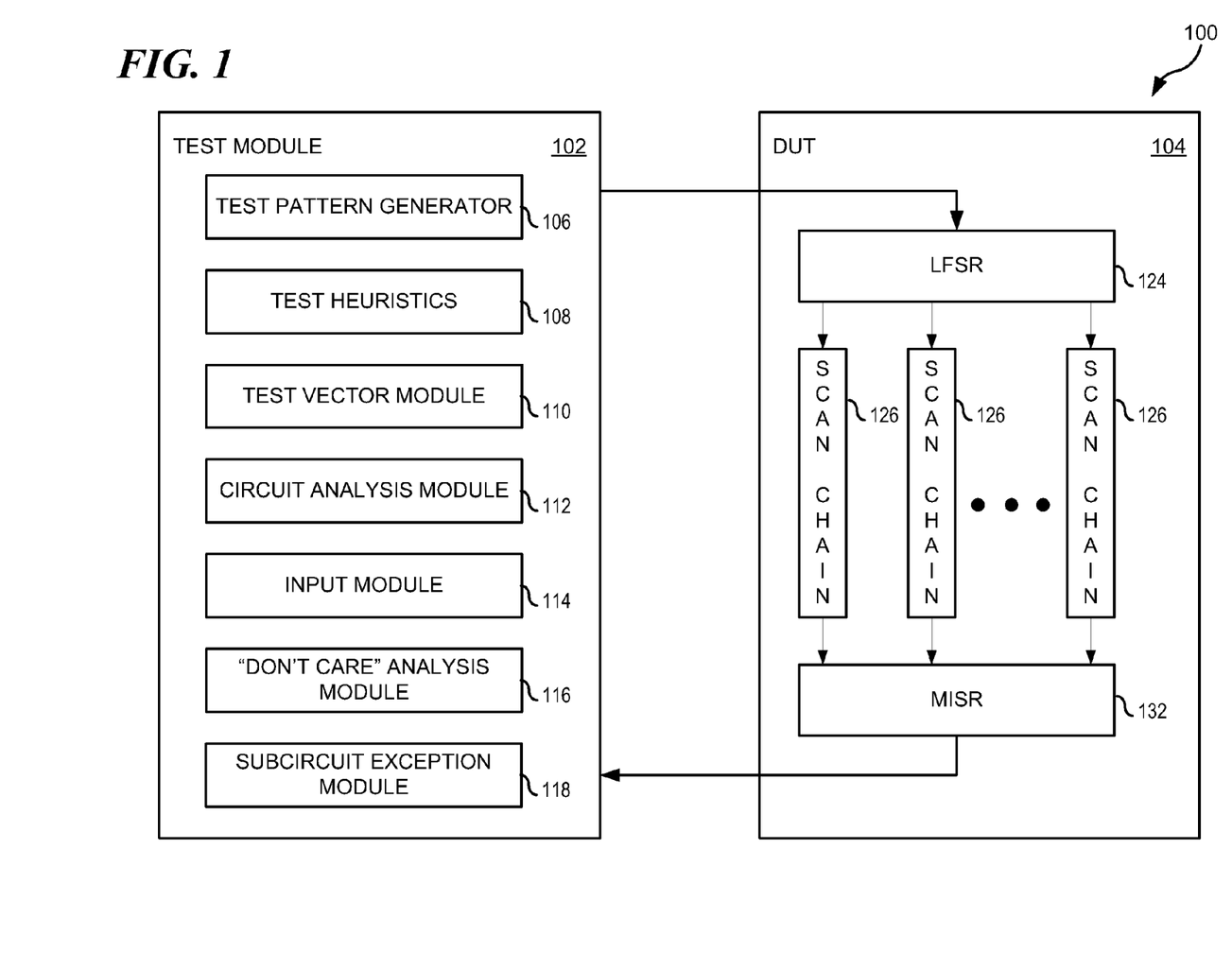
FIG. 1 illustrates a block diagram showing a test module connected to a device under test in accordance with a preferred embodiment.

Referring now to the drawings, FIG. 1 is a high-level block diagram illustrating certain components of a system 100 for power reduction through power aware latch weighting, in accordance with one embodiment of the present invention. In the illustrated embodiment, system 100 comprises a test module 102 and a device under test (DUT) 104.

In the illustrated embodiment, test module 102 is an otherwise conventional test module, modified as described below. Test module 102 comprises a test pattern generator 106, a test heuristics module 108, a test vector module 110, a circuit analysis module 112, an input module 114, a don't-care analysis module 116, and a sub-circuit exception module 118.

In the illustrated embodiment, test pattern generator 106 is an otherwise conventional test pattern generator, modified as described below. Generally, test pattern generator 106 generates a test pattern for DUT 104 based on data provided by test heuristics module 108.

In the illustrated embodiment, test heuristics module 108 is an otherwise conventional test heuristics module, modified as described below. Generally, test heuristics module 108 develops test heuristics for the particular device under test. In one embodiment, test heuristics module 108 develops test heuristics for DUT 104 based on user input.

In the illustrated embodiment, test vector module 110 is an otherwise conventional test vector module, modified as described below. Generally, test vector module 110 generates test vectors to be applied to DUT 104 based on the test pattern generated by test pattern generator 106, and don't-care analysis module 116. In the illustrated embodiment, circuit analysis module 112 is an otherwise conventional circuit analysis module, modified as described below. Generally, in one embodiment, circuit analysis module determines the logical description of the circuits in DUT 104.

In the illustrated embodiment, input module 114 is an otherwise conventional input module modified as described below. Generally, input module 114 receives user input, which includes configuration data to modify the test heuristics, test patterns, test vectors, and other test data, as described in more detail below.

In the illustrated embodiment, don't-care analysis module 116 is an otherwise conventional don't-care analysis module, modified as described below. Generally, don't-care analysis module 116 identifies absolute and don't-care latches in DUT 104. Don't-care analysis module 116 assigns weights to the absolute and conditional don't-care latches in DUT 104 as described in more detail below.

Additionally, don't-care analysis module 116 identifies absolute and conditional don't-care bits in the test pattern generated by test pattern generator 106. In one embodiment, don't-care analysis module 116 replaces the absolute and applicable conditional don't-care bits in the test pattern generated by test pattern generator 106.

In the illustrated embodiment, sub-circuit exception module 118 is an otherwise conventional sub-circuit exception module modified as described below. Generally, sub-circuit exception module 118 stores don't-care weights for certain known logic configurations. Specifically, sub-circuit exception module 118 stores don't-care weights for sub-circuits that are known to be exceptions to the don't-care weights assigned on a latch-by-latch basis, as described in more detail below. Sub-circuit exception module 118 also determines the appropriate don't-care weight values for unknown sub-circuits in DUT 104. System 400 of FIG. 4, below, describes the process of determining the don't-care weight values for unknown sub-circuits in accordance with one embodiment of the present invention.

In the illustrated embodiment, DUT 104 is an otherwise conventional electronic circuit device under test. DUT 104 comprises linear feedback shift register (LFSR) 124, various scan chains 126, and a multiple input signature register (MISR) 132. In the illustrated embodiment, LFSR 124 is an otherwise conventional LFSR and receives a linear test vector used for testing various scan chains of DUT 104. Each scan chain 126 is an otherwise conventional scan chain, connecting every logical operator in DUT 104 into a long shift register. When test module 102 applies the test vector to DUT 104 through LFSR 124, test module 102 can read out the operation of every logical operator and the state of every logical operator, through MISR 132. MISR 132 is an otherwise conventional MISR, configured to unload the responses of the scan chains 126 into test module 102.

In a general exemplary operation in accordance with one embodiment, circuit analysis module 112 analyzes the circuits of DUT 104. Circuit analysis module 112 identifies sub-circuits within DUT 104, and selects the currently identified sub-circuit. Sub-circuit exception module 118 determines whether the logical description of the selected sub-circuit is known. If the logical description of the sub-circuit is known, sub-circuit exception module 118 determines if the known logical description is a known variant from predetermined power aware latch weighting for power reduction during -speed testing.

In the general exemplary operation of the illustrated embodiment, if the sub-circuit is a known variant, sub-circuit exception module 118 assigns weights to the inputs of the currently selected sub-circuit don't-care latches based on the weights stored in the sub-circuit exception module database. If the sub-circuit is not a known variant, sub-circuit exception module 118 assigns the standard don't-care latch weights to the inputs of the don't-care latches of the currently selected sub-circuit.

In the general exemplary operation of the illustrated embodiment, if the logical description of the currently selected sub-circuit is not a known sub-circuit, sub-circuit exception module 118 adds the logical description of the sub-circuit to the database in sub-circuit exception module 118. After the logical description of the sub-circuit has been stored, sub-circuit exception module 118 assigns the standard weights to the don't-care latches of the currently selected sub-circuit.

In the general exemplary operation of the illustrated embodiment, for an unknown sub-circuit, sub-circuit exception module 118 simulates power through the sub-circuit using the standard weighted values in a first simulation. Sub-circuit exception module 118 receives and stores the power data from the first simulation. Sub-circuit exception module 118 then selects and assigns a second set of weights to the inputs of the currently selected sub-circuit. Sub-circuit exception module 118 simulates power through the sub-circuit using the second assigned weights, receiving and storing power data in a second simulation. Sub-circuit exception module 118 compares the power data from the first simulation to the power data from the second simulation and stores the weights from the simulation with the lower power usage for the logical description of the circuit in the database.

Figure 2:
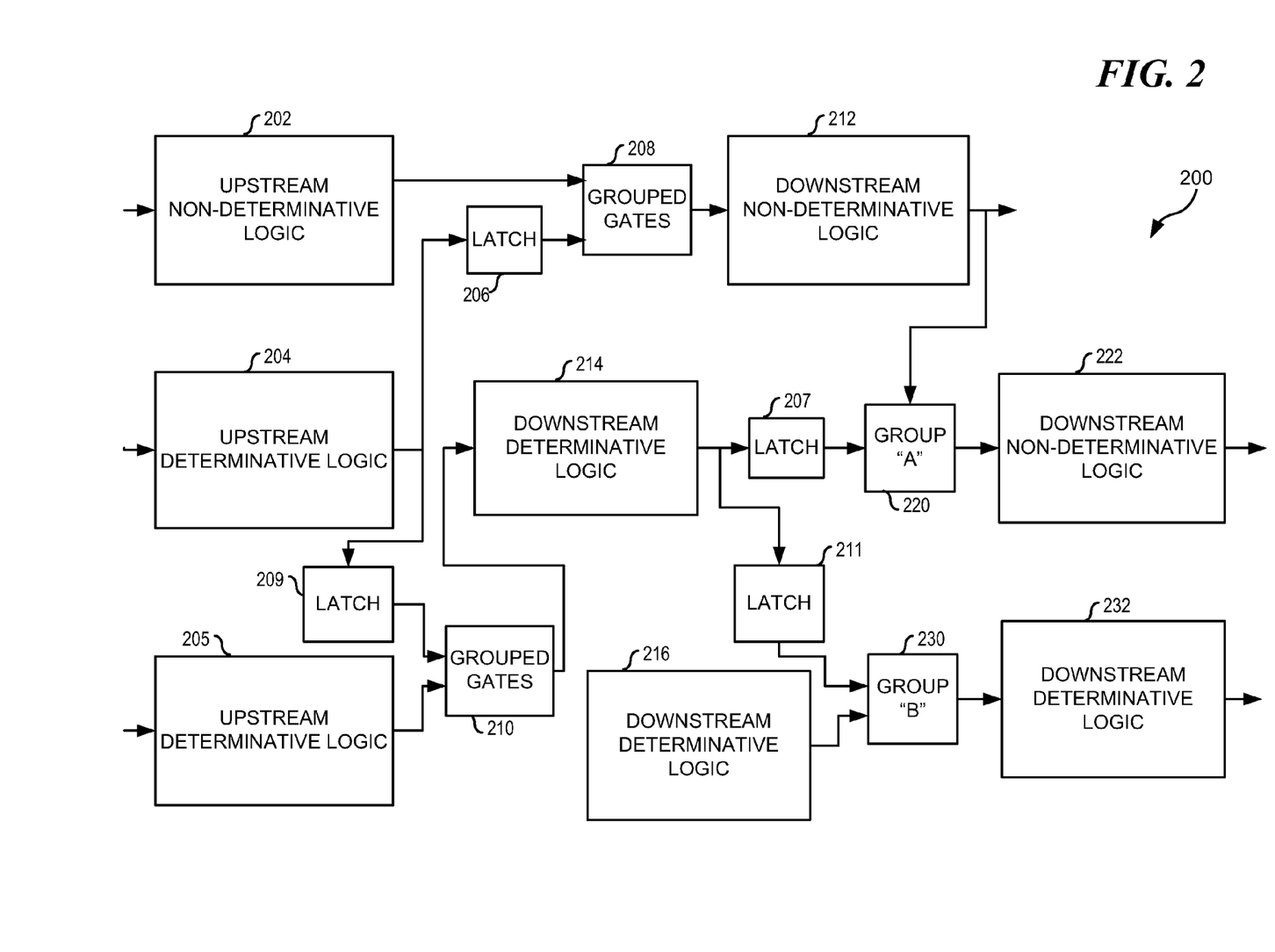
FIG. 2 illustrates a block diagram showing a scan chain of a device under test in accordance with a preferred embodiment.

In the exemplary operative embodiment, test module 102 generates test vectors according to a conventional process to generate test vectors, modified as described herein. Test module 102 applies the test vector to DUT 104 through LFSR 124. The test patterns propagate through the various scan chains 126 to MISR 132, which compresses the output into a test signature suitable for review. Thus, FIG. 1 illustrates one embodiment of a system for reducing power during -speed testing by selectively replacing the bit position values for latches in selected known sub-circuits so as to minimize testing power. FIG. 2 illustrates in more detail a mechanism to identify absolute and conditional don't-care bits that are suitable for the power aware weighting described herein.

Specifically, FIG. 2 illustrates system 200, which comprises a plurality of logic operators of a DUT, coupled together to form a part of a scan chain. One skilled in the art will understand that logic operators coupled in a scan chain can be in distinct and different functional devices. As illustrated, system 200 comprises a plurality of determinative and non-determinative logic, and various latches and gates.

In particular, system 200 includes upstream non-determinative logic 202, upstream determinative logic 204, and upstream determinative logic 205. Generally, upstream non-determinative logic 202 represents circuit components positioned earlier in the functional or scan path that do not determine the output of the test for the test pattern, heuristic, or vector under consideration. As shown, the output of upstream non-determinative logic 202 feeds (through gate 208) downstream non-determinative logic 212. As such, the test patterns applied to the DUT can fill the bit positions associated with the latches of upstream non-determinative logic 202 (and downstream non-determinative logic 212) with don't-care bits.

For example, both upstream non-determinative logic 202 and latch 206 are inputs to gate 208. Conventional systems would fill the test pattern bit positions associated with latch 206 and upstream non-determinative logic 202 in one of the conventional don't-care fill heuristics described above. As such, depending on the particular logic function of gate 208, the gate 208 output may switch frequently, causing wasted power dissipation. In the embodiments disclosed herein, however, the test module sets the bit in the bit position associated with latch 206 based on the particular logic function of gate 208, so as to force the output of gate 208 into a stable, unchanging signal.

For example, as described above, where gate 208 is a NAND gate and latch 206 is an absolute don't-care latch, the test module sets the bit in the bit position associated with latch 206 to zero. As such, the output of (NAND) gate 208 is fixed at zero, reducing switching associated with fluctuation in the gate 208 output. Further, fixing the output of gate 208 fixes the input to downstream non-determinative logic 212. As the input to downstream non-determinative logic 212 is not changing, the logic comprising downstream non-determinative logic 212 does not change either, also reducing switching power.

Upstream determinative logic 204 provides input to both latch 206 and latch 209. In the event the upstream determinative logic 204 output changes, the input to latch 206 changes. As such, in some cases, the don't-care bits of upstream non-determinative logic 202 can be fixed to provide the weighted input to latch 206 to fix gate 208 output.

As illustrated, upstream determinative logic 204 (though latch 209) and upstream determinative logic 205 provide input to gate 210. As such, gate 210 is not a don't-care latch, as its state will affect the output test signature. Accordingly, system 200 applies to latch 210 the bit value for the bit position in the test pattern associated with latch 210, as is typical.

Accordingly, in general operation, system 200 applies either the test pattern bit value or the modified don't-care bit value described herein to each bit position in the scan chain, according to that bit position. Generally, the system sets determinative logic latches (latches that follow or feed determinative logic) according to the test pattern bit provided for the test. Generally, the system sets non-determinative logic latches according to the process described herein, further distinguishing between absolute and conditional don't-care status.

Generally, an "absolute don't-care latch" is a latch that does not affect the test result output signature for the test pattern under consideration in any case. An "absolute don't-care bit" is a bit position in a test vector associated with an absolute don't-care latch. As described above, in the illustrated embodiment, latch 206 is an absolute don't-care latch.

A "conditional don't-care" latch is a latch that sometimes does not affect the test result output signature for the test pattern under consideration, depending on other factors as one skilled in the art will understand. A "conditional don't-care bit" is a bit position in a test vector associated with a conditional don't-care latch. For example, as illustrated, downstream determinative logic 214 feeds latch 207, which is one of the inputs to gate "A" 220. The other input to gate "A" 220 is downstream non-determinative logic 212. Because gate "A" 220 feeds downstream non-determinative logic 222, it is an absolute don't-care latch.

But downstream determinative logic also feeds latch 211, which is one of the inputs to gate "B" 230. The other input to gate "B" 230 is downstream determinative logic 216. Depending on the logic function embodied in gate "B" 230, the bit value stored in latch 211 might have no effect on the output of gate "B" 230. For example, where gate "B" 230 is an AND gate, and downstream determinative logic 216 output is a zero, the gate "B" 230 output will be zero regardless of what bit value is stored by latch 211. As such, latch 211 is a "conditional don't-care latch."

Thus, in one embodiment, a circuit analysis module identifies the particular logic gates and don't-care latches in a device under test, and a don't-care analysis module determines whether a particular latch is an absolute or conditional don't-care latch. A test vector module uses the results from the don't-care analysis module to set the particular don't-care bits in the test pattern to apply to the DUT for testing. Thus, generally, in one embodiment, system 100 of FIG. 1 operates on a DUT, such as system 200 of FIG. 2, as described with respect to FIG. 3.

Figure 3:
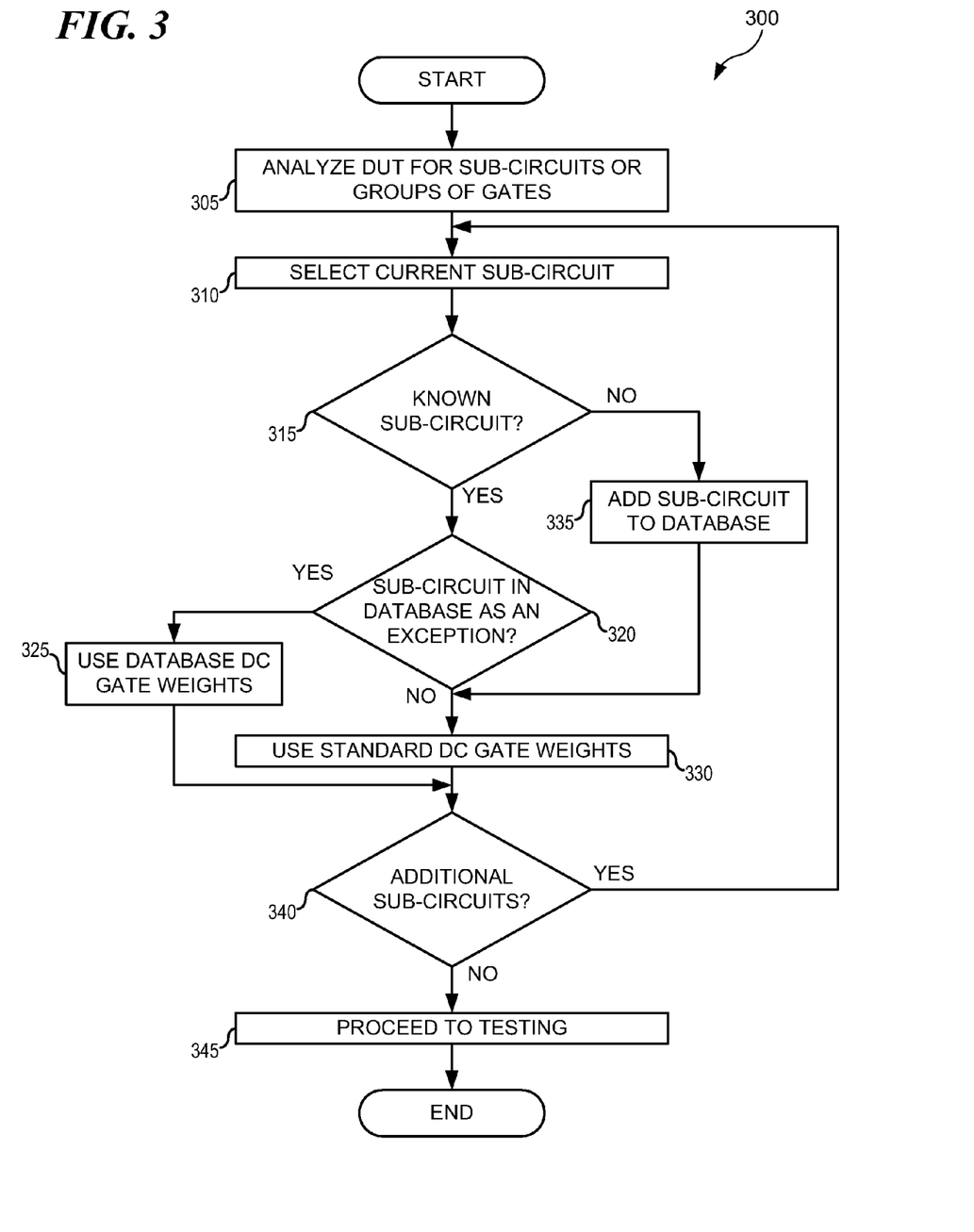
FIG. 3 illustrates a high-level flow diagram depicting logical operational steps for reducing power through power aware latch weighting, which can be implemented in accordance with a preferred embodiment.

Specifically, FIG. 3 illustrates a high-level flow chart of system 300 that depicts logical operative steps performed by, for example, system 100 of FIG. 1, which may be implemented in accordance with a preferred embodiment. As indicated at block 305, the process begins and system 100 analyzes a DUT for sub-circuits or groups of sub-circuits. For example, circuit analysis module 112 analyzes DUT 104 for sub-circuits or groups of gates. Next, as indicated at block 310, system 100 selects a current sub-circuit.

Next, as indicated at decisional block 315, system 100 determines whether the current sub-circuit is a known sub-circuit. For example, sub-circuit exception module 118 checks the current sub-circuit in DUT 104 to determine whether the selected sub-circuit matches the logical description of a known sub-circuit stored in the database of sub-circuit exception module 118.

As indicated at decisional block 315, if the currently selected sub-circuit is a known sub-circuit, the process continues along the YES branch to decisional block 320. As indicated at decisional block 320, system 100 determines whether the currently selected sub-circuit is a known exception to the at speed test utilizing power aware latch weighting to reduce power. For example, sub-circuit exception module 118 checks the exception database stored in sub-circuit exception module 118 to determine if the current known sub-circuit is a variant from predetermined power aware latch weighting for power reduction during -speed testing.

Generally, co-pending application AUS920070876US1 teaches a power aware latch weighting for power reduction during -speed testing that can be employed in conjunction with the novel embodiments disclosed herein. Specifically, as disclosed in the co-pending application, the bit position in a test pattern corresponding to certain don't-care latches can be set so as to reduce output switching in logic downstream from the don't-care latches. The novel embodiments disclosed herein reduce power consumption during testing by, among other things, identifying sub-circuit configurations that vary from the expected latch-by-latch power aware don't-care latch settings.

That is, in some cases, the particular configuration of a group of latches allows for a greater power reduction than can be achieved through latch-by-latch analysis alone. For example, where the don't-care latches of a particular test pattern form a multiplexer (mux) to select between two sections of logic, the mux testing power can sometimes be reduced by selecting don't-care weights that are different from the don't-care weights that would otherwise be assigned on a latch-by-latch basis according to the power aware don't-care latch weighting described in the co-pending application identified above.

Specifically, for example, where the mux select signal is a don't-care value, power aware latch weighting, in one embodiment, sets the mux output based on the type of logic gate implementing the mux. If system 100 knows that a particular don't-care configuration for the mux results in a lower power consumption than the default power aware configuration, system 100 stores that particular don't-care configuration as a "variant" or an "exception" in a database, which system 100 checks as indicated at decisional block 320. In one embodiment, the exception database is a component of sub-circuit exception module 118.

As indicated at decisional block 320, system 100 determines whether the identified sub-circuit is a known exception sub-circuit. If at decisional block 320 the currently selected sub-circuit is an exception sub-circuit, the process continues along the YES branch to block 325. As indicated at block 325, system 100 applies the don't-care values assigned to the sub-circuit in the database and the process continues to decisional block 340. For example, sub-circuit analysis module 118 assigns the inputs to the currently selected sub-circuit based on the stored values in the database for the known sub-circuit exception to the currently selected sub-circuit in DUT 104.

If at decisional block 320 the identified sub-circuit is not an exception sub-circuit, the process continues along the NO branch to block 330. As indicated at block 330, system 100 applies the standard don't-care sub-circuit weights and the process continues to decisional block 340. For example, don't-care analysis module 116 assigns the standard weights to the inputs of the currently sub-circuit in DUT 104. In one embodiment, the standard don't-care sub-circuit weights correspond to power aware don't-care latch weighting as described in the co-pending application identified above.

As indicated at decisional block 315, if the selected sub-circuit is a not a known sub-circuit, the process continues along the NO branch to block 335. As indicated at block 335, system 100 adds the selected sub-circuit to the database, marked for subsequent analysis testing, and the process continues to block 330. For example, sub-circuit exception module 118 adds the logical description of the current sub-circuit to the database of known sub-circuits in sub-circuit exception module 118 and marks the logical description for subsequent analysis testing. In one embodiment, sub-circuit exception module 118 also assigns default weights for don't-care latch values associated with the sub-circuit.

Next, as indicated at block 330, system 100 assigns the standard don't-care sub-circuit weights in generating the test vectors, as described above. For example, don't-care analysis module 116 assigns the standard don't-care sub-circuit weights to the inputs of the currently selected sub-circuit in DUT 104.

Next, as indicated at block 340, system 100 checks for additional sub-circuits. For example, circuit analysis module 112 checks DUT 104 for additional sub-circuits. As indicated at decisional block 340, if there are additional sub-circuits for analysis, the process continues along the YES branch, returning to block 310, described above. As indicated at decisional block 340, if there are not additional sub-circuits for analysis, the process continues along the NO branch to block 345.

As indicated at block 345, system 100 proceeds to the DUT testing process and the process described herein ends. For example, if circuit analysis module 112 does not identify any additional sub-circuits for analysis, test module 102 proceeds to the DUT testing process.

Figure 4:
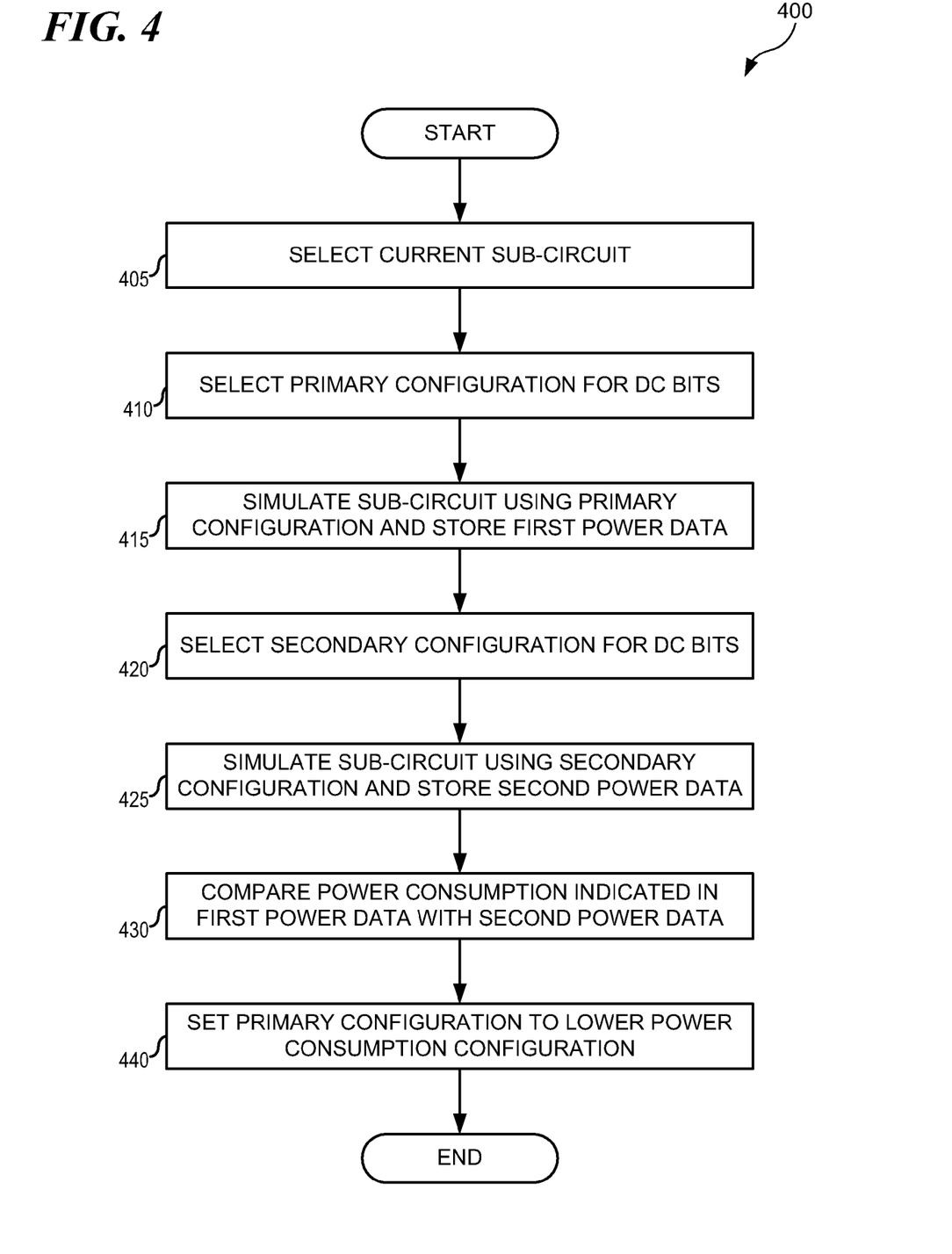
FIG. 4 illustrates a high-level flow diagram depicting logical operational steps for reducing power through power aware latch weighting, which can be implemented in accordance with a preferred embodiment.

As described above, in one embodiment, system 100 stores variant don't-care configurations in a database in sub-circuit exception module 118. System 100 populates this database based on simulation testing and comparison. FIG. 4 illustrates this simulation testing and comparison in one embodiment. Specifically, FIG. 4 illustrates a high-level flow chart 400 that depicts logical operational steps performed by, for example, system 100 of FIG. 1, which may be implemented in accordance with a preferred embodiment. As indicated at block 405, the process begins, wherein system 100 selects a current sub-circuit. For example, circuit analysis module 112 selects a current sub-circuit of the known sub-circuits marked for analysis testing in the known sub-circuit database.

Next, as indicated at block 410, system 100 selects a primary configuration for the don't-care bits of the current sub-circuit. For example, sub-circuit exception module 118 assigns the primary don't-care bit weight values to the inputs of the currently selected sub-circuit in DUT 104. In one embodiment, sub-circuit exception module 118 assumes that every latch in the current sub-circuit is a don't-care latch. One skilled in the art will understand that the particular applicable test heuristic and test pattern determines the status of any particular latch (e.g., don't-care or set to a particular value). In such cases, a particular bit value dictated by the test pattern trumps the don't-care values assigned herein as to the test vectors generated from that test pattern.

Next, as indicated at block 415, system 100 simulates, in a first test, power consumption during -speed testing of the currently selected sub-circuit configured with the primary configuration. The first test produces the first power data, which describes the power consumption of the sub-circuit during -speed testing. For example, sub-circuit exception module 118 simulates power through the currently selected sub-circuit in DUT 104 and stores the first power data produced by the first test.

Next, as indicated at block 420, system 100 selects a secondary configuration for the don't-care bits. For example, sub-circuit exception module 118 selects an alternate configuration for the values of the don't-care bits of the currently selected sub-circuit in DUT 104. In one embodiment, the alternate configuration is based on user input. Next, as indicated at block 425, system 100 simulates, in a second test, power consumption during -speed testing of the currently selected sub-circuit configured with the secondary configuration. The second test produces the second power data, which describes the power consumption of the sub-circuit during -speed testing. For example, sub-circuit exception module 118 simulates power through the currently selected sub-circuit in DUT 104 using the secondary don't-care value bit configuration and stores the second power data in sub-circuit exception module 118.

Next, as indicated at block 430, system 100 compares the power consumption indicated in the first power data with the power consumption indicated in the second power data. In an alternate embodiment, system 100 reports the first power data and the second power data to a user, and the user compares the power consumption of each.

Next, as indicated at block 440, system 100 sets the primary configuration to the lower of the two power consumption configurations based on the comparison described above with respect to block 430. For example, sub-circuit analysis module 118 sets the primary don't-care bit value configuration for the logical description of the currently selected sub-circuit in DUT 104 to the configuration that consumed the least power, and stores the primary configuration in a database in sub-circuit analysis module 118. Accordingly, the process analyzes two alternate configurations for sub-circuit logical descriptions, tests each configuration for power consumption during -speed testing, and sets the primary configuration to the tested configuration drawing the least power between the two. As such, system 100 can be configured to maintain a database of known sub-circuit configurations with lower power don't-care bit position configurations as those configurations are discovered. Further, the processes illustrated in FIG. 3 and FIG. 4 can be configured to operate in conjunction with an improved don't-care bit value assignment system, such as, for example, as described in FIG. 5.

Figure 5:
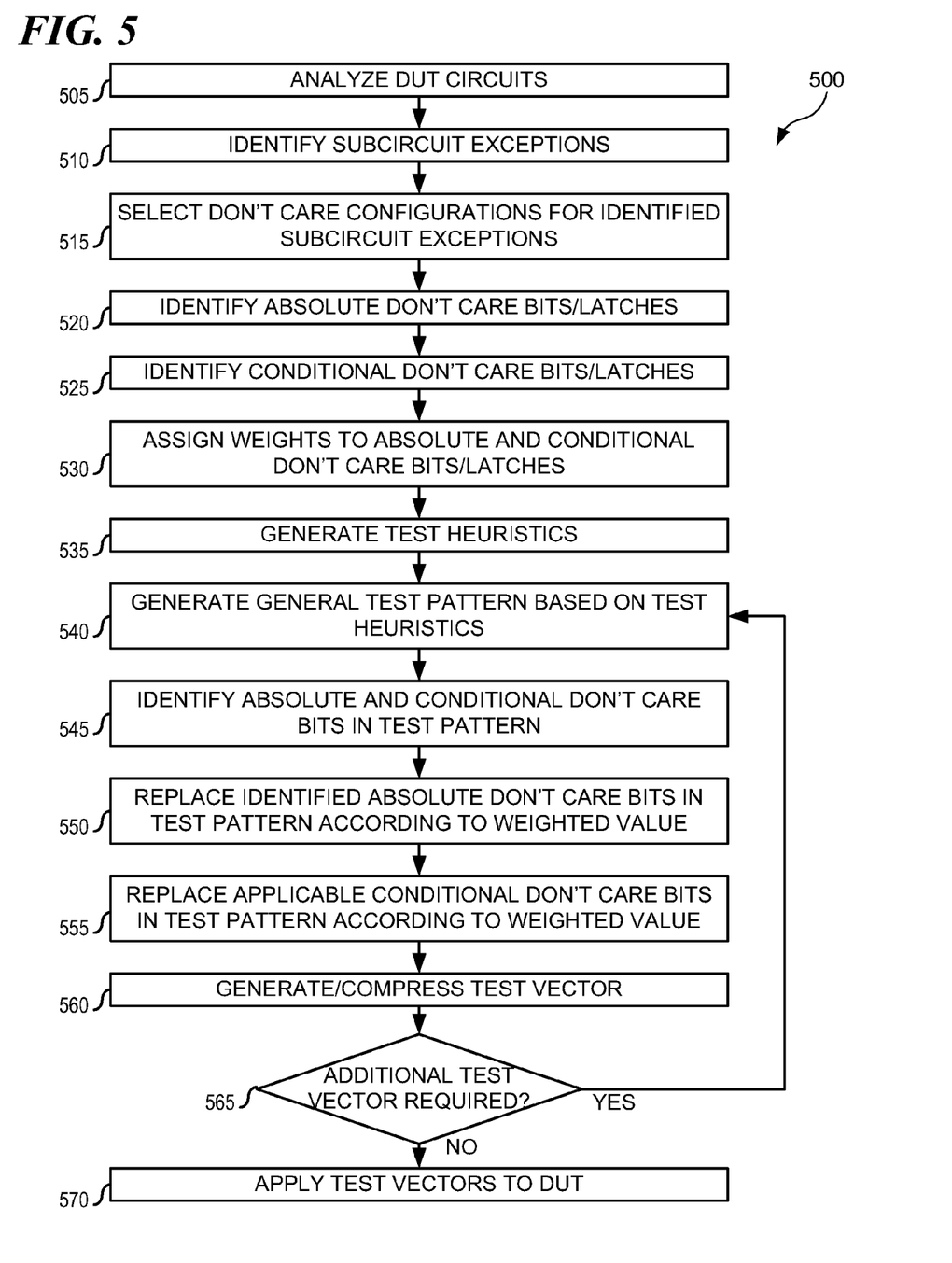
FIG. 5 illustrates a high-level flow diagram depicting logical operational steps for reducing power through power aware latch weighting, which can be implemented in accordance with a preferred embodiment.

Specifically, FIG. 5 illustrates a high-level flow chart 500 that depicts logical operational steps performed by, for example, system 100 of FIG. 1, which may be implemented in accordance with a preferred embodiment. Generally, test module 102 performs the steps of the method, unless indicated otherwise. As indicated at the block 505, the process begins, and system 100 analyzes the circuits of a DUT. For example, circuit analysis module 112 of test module 102 analyzes the circuits of DUT 104.

Next, as indicated at block 510, system 100 identifies the absolute don't-care latches. For example, don't-care analysis module 116 identifies the absolute don't-care latches in DUT 104. Next, as indicated at block 515, system 100 identifies the conditional don't-care latches in the DUT. For example, don't-care analysis module 116 identifies the conditional don't-care latches in DUT 104.

Next, as indicated at block 520, system 100 assigns weights to the identified absolute and conditional don't-care latches. For example, don't-care analysis module assigns weights to the absolute and don't-care latches in DUT 104. Next, as indicated at block 525, system 100 generates test heuristics for the DUT. For example, test heuristics module 108 generates test heuristics for DUT 104.

Next, as indicated at block 530, system 100 generates a general test pattern based on the test heuristics. For example, test pattern generator 106 generates a general test pattern based on the test heuristics developed by test heuristics module 108. Next, as indicated at block 535, system 100 identifies absolute and conditional don't-care bits in the test pattern. For example, don't-care analysis module 116 identifies absolute and conditional don't-care bits in the test pattern generated by test pattern generator 106.

Next, as indicated at block 540, system 100 replaces the identified absolute don't-care bits in the test pattern according to a weighted value for the latch associated with the bit position of each don't-care bit. For example, don't-care analysis module 116 replaces the identified absolute don't-care bits in the test pattern with a weighted value selected so that the logic gate will not propagate a changing signal, as described above. Next, as indicated at block 550, system 100 replaces applicable conditional don't-care bits in the test pattern according to a weighted value. For example, don't-care analysis module 116 replaces the applicable conditional don't-care bits in the test pattern generated by test pattern generator 106 with a weighted value for the latch associated with the bit position of each don't-care bit.

Next, as indicated at block 555, system 100 generates or compresses a test vector. For example, test vector module 110 generates or compresses a test vector based on the test pattern generated by test pattern generator 106 and modified by circuit analysis module 116. Next, as indicated at block 560, system 100 determines if additional test vectors are required. For example, test vector module 110 determines if additional test vectors are required for DUT 104.

As indicated at decisional block 560, if additional test vectors are not required, the process continues along the NO branch to block 565. As indicated at block 565, system 100 applies the test vectors to the DUT and the process ends. For example, input module 114 applies the test vectors to DUT 104 through LFSR 124. If at decisional block 560 additional test vectors are required the process continues along the YES branch, returning to block 530.

Accordingly, the disclosed embodiments provide numerous advantages over other methods and systems. For example, the disclosed embodiments provide a testing power reduction technique that does not cause an increased number of transitions during -speed testing, and accordingly does not cause high power dissipation. Further, the disclosed embodiments achieve the described power reduction without decreasing the test clock frequency, which allows for improved -speed testing.

Additionally, the embodiments disclosed herein reduce power by taking into account the actual topography of the device under test, and using the known topography to select bit values to fill in otherwise don't-care bit positions, reducing switching power. Further, the embodiments disclosed herein provide flexibility in sub-circuit level don't-care bit value assignment, incorporating a mechanism to detect previously uncatalogued sub-circuit configurations, and to determine which, of a plurality of don't-care configurations, results in the lowest power consumption during -speed testing.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

The invention claimed is:

1. A system embodied in a hardware system, comprising:
   a circuit analysis module configured to analyze a device under test (DUT), the DUT comprising a plurality of latches coupled together in a scan chain;
   wherein the circuit analysis module is further configured to identify sub-circuits within the DUT;
   a don't-care analysis module coupled to the circuit analysis module and configured to identify absolute don't-care latches associated with the identified sub-circuits;
   wherein the circuit analysis module is further configured to identify a logical description of an identified sub-circuit;
   a sub-circuit exception module coupled to the circuit analysis module and configured to select weighted input values for an identified sub-circuit, based on the identified absolute don't-care latches and the logical description of the identified sub-circuit; and
   wherein the sub-circuit exception module is further configured to store the selected weighted input values for the identified sub-circuit and to associate the selected weighted input values with the logical description.

2. The system of claim 1, further comprising:
   wherein the don't-care analysis module is further configured to identify conditional don't-care latches associated with the identified sub-circuits; and
   wherein the sub-circuit exception module is further configured to select weighted input values for an identified sub-circuit based on the identified conditional don't-care latches and the logical description of the identified sub-circuit.

3. The system of claim 1, further comprising:
   wherein the don't-care analysis module is further configured to identify absolute don't-care bits within a general test pattern;
   wherein the sub-circuit exception module is further configured to replace identified absolute don't-care bits in the general test pattern according to the stored weighted value associated with the logical description of the identified sub-circuit, to generate a weighted test pattern;
   a test vector module coupled to the test pattern generator module and configured to generate a test vector based on the weighted test pattern; and
   an input module configured to apply the test vector to the DUT.

4. The system of claim 1, further comprising:
   wherein the don't-care analysis module is further configured to identify conditional don't-care bits within a general test pattern;
   wherein the sub-circuit exception module is further configured to replace identified conditional don't-care bits in the general test pattern according to the stored weighted value associated with the logical description of the identified sub-circuit, to generate a weighted test pattern;
   a test vector module coupled to the test pattern generator module and configured to generate a test vector based on the weighted test pattern; and
   an input module configured to apply the test vector to the DUT.

5. The system of claim 1, further comprising:
   a test heuristics module configured to generate test heuristics; and
   a test pattern generator module coupled to the test heuristics module and configured to generate a general test pattern based on the test heuristics.

6. The system of claim 1, wherein selecting weighted input values comprises:
   comparing the logical description of the identified sub-circuit to a database of known sub-circuits, the database comprising a plurality of weights associated with each known sub-circuit;
   if the identified sub-circuit is a known sub-circuit, using the weights stored in the sub-circuit exception module; and
   if the identified sub-circuit is not a known sub-circuit, storing the logical description of the identified sub-circuit.

7. The system of claim 6, wherein selecting weighted input values further comprises, in the event the identified sub-circuit is not a known sub-circuit:
   weighting the input values of the identified sub-circuit with a first weight configuration;
   simulating power through the identified sub-circuit in a first test;
   generating a first power data based on the first weight configuration and the first test;
   weighting the input values of the identified sub-circuit with a second weight configuration;
   simulating power through the identified sub-circuit in a second test;
   generating a second power data based on the second weight configuration and the second test;
   comparing the first power data to the second power data;
   selecting the weight configuration requiring lower power consumption; and
   storing the selected weight configuration in the database as associated with the identified sub-circuit.

8. A method, comprising:
analyzing a device under test (DUT) to identify sub-circuits within the DUT, the DUT comprising a plurality of latches coupled together in a scan chain;
identifying absolute don't-care latches associated with the identified sub-circuits;
identifying a logical description of an identified sub-circuit;
selecting weighted input values for the identified sub-circuit, based on the identified absolute don't-care latches and the logical description;
storing the selected weighted input values for the identified sub-circuit; and
associating the selected weighted input values with the logical description of the identified sub-circuit.

9. The method of claim 8, further comprising:
identifying conditional don't-care latches associated with the identified sub-circuits; and
selecting weighted input values for an identified sub-circuit based on the identified conditional don't-care latches and the logical description of the identified sub-circuit.

10. The method of claim 8, further comprising:
identifying absolute don't-care bits within a general test pattern;
replacing identified absolute don't-care bits in the general test pattern according to the stored weighted value associated with the logical description of the identified sub-circuit, to generate a weighted test pattern;
generating a test vector based on the weighted test pattern; and
applying the test vector to the DUT.

11. The method of claim 8, further comprising:
identifying conditional don't-care bits within a general test pattern;
replacing identified conditional don't-care bits in the general test pattern according to the stored weighted value associated with the logical description of the identified sub-circuit, to generate a weighted test pattern;
generating a test vector based on the weighted test pattern; and
applying the test vector to the DUT.

12. The method of claim 8, further comprising:
generating test heuristics; and
generating a general test pattern based on the test heuristics.

13. The method of claim 8, wherein selecting weighted input values comprises:
comparing the logical description of the identified sub-circuit to a database of known sub-circuits, the database comprising a plurality of weights associated with each known sub-circuit;
if the identified sub-circuit is a known sub-circuit, using the weights stored in the sub-circuit exception module; and
if the identified sub-circuit is not a known sub-circuit, storing the logical description of the sub-circuit.

14. The method of claim 13, wherein selecting weighted input values further comprises, in the event the identified sub-circuit is not a known sub-circuit:
weighting the input values of the identified sub-circuit with a first weight configuration;
simulating power through the identified sub-circuit in a first test;
generating a first power data based on the first weight configuration and the first test;
weighting the input values of the identified sub-circuit with a second weight configuration;
simulating power through the identified sub-circuit in a second test;
generating a second power data based on the second weight configuration and the second test;
comparing the first power data to the second power data;
selecting the weight configuration requiring lower power consumption; and
storing the selected weight configuration in the database as associated with the identified sub-circuit.

15. A computer program product for power reduction during testing, the computer program product comprising:
a non-transitory computer usable medium having computer useable program code embodied therewith, the computer useable program code comprising:
computer usable program code configured to analyze a device under test (DUT) to identify sub-circuits within the DUT, the DUT comprising a plurality of latches coupled together in a scan chain;
computer usable program code configured to identify absolute don't-care latches associated with the identified sub-circuits;
computer usable program code configured to identify a logical description of an identified sub-circuit;
computer usable program code configured to select weighted input values for the identified sub-circuit, based on the identified absolute don't-care latches and the logical description;
computer usable program code configured to store the selected weighted input values for the identified sub-circuit; and
computer usable program code configured to associate the selected weighted input values with the logical description of the identified sub-circuit.

16. The computer program product of claim 15, further comprising:
computer usable program code configured to identify conditional don't-care latches associated with the identified sub-circuits; and
computer usable program code configured to select weighted input values for an identified sub-circuit based on the identified conditional don't-care latches and the logical description of the identified sub-circuit.

17. The computer program product of claim 15, further comprising:
computer usable program code configured to identify absolute don't-care bits within a general test pattern;
computer usable program code configured to replace identified absolute don't-care bits in the general test pattern according to the stored weighted value associated with the logical description of the identified sub-circuit, to generate a weighted test pattern;
computer usable program code configured to generate a test vector based on the weighted test pattern; and
computer usable program code configured to apply the test vector to the DUT.

18. The computer program product of claim 15, further comprising:
computer usable program code configured to identify conditional don't-care bits within a general test pattern;
computer usable program code configured to replace identified conditional don't-care bits in the general test pattern according to the stored weighted value associated with the logical description of the identified sub-circuit, to generate a weighted test pattern;
computer usable program code configured to generate a test vector based on the weighted test pattern; and computer usable program code configured to apply the test vector to the DUT.

19. The computer program product of claim 15, wherein selecting weighted input values comprises:
comparing the logical description of the identified sub-circuit to a database of known sub-circuits, the database comprising a plurality of weights associated with each known sub-circuit;
if the identified sub-circuit is a known sub-circuit, using the weights stored in the sub-circuit exception module; and
if the identified sub-circuit is not a known sub-circuit, storing the logical description of the sub-circuit.

20. The computer program product of claim 19, wherein selecting weighted input values further comprises, in the event the identified sub-circuit is not a known sub-circuit:
weighting the input values of the identified sub-circuit with a first weight configuration;
simulating power through the identified sub-circuit in a first test;
generating a first power data based on the first weight configuration and the first test;
weighting the input values of the identified sub-circuit with a second weight configuration;
simulating power through the identified sub-circuit in a second test;
generating a second power data based on the second weight configuration and the second test;
comparing the first power data to the second power data;
selecting the weight configuration requiring lower power consumption; and
storing the selected weight configuration in the database as associated with the identified sub-circuit.

* * * * *